(12) United States Patent
Gasner et al.

(10) Patent No.: US 7,341,958 B2
(45) Date of Patent: Mar. 11, 2008

(54) INTEGRATED PROCESS FOR THIN FILM RESISTORS WITH SILICIDES

(75) Inventors: John T. Gasner, Satellite Beach, FL (US); John Stanton, Palm Bay, FL (US); Dustin A. Woodbury, Indian Harbour Beach, FL (US); James D. Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 90 days.

(21) Appl. No.: 11/101,891

(22) Filed: Apr. 8, 2005

(65) Prior Publication Data

US 2006/0166505 A1  Jul. 27, 2006

Related U.S. Application Data

(60) Provisional application No. 60/646,189, filed on Jan. 21, 2005.

(51) Int. Cl.
*H01L 21/461* (2006.01)

(52) U.S. Cl. ............ 438/720; 438/745; 438/754; 216/103; 216/106

(58) Field of Classification Search ........... 438/720, 438/745, 754; 216/103, 106
See application file for complete search history.

(56) References Cited

U.S. PATENT DOCUMENTS

| | | | | |
|---|---|---|---|---|
| 4,755,480 A | * | 7/1988 | Yau et al. | 438/384 |
| 5,256,247 A | * | 10/1993 | Watanabe et al. | 216/16 |
| 5,547,896 A | * | 8/1996 | Linn et al. | 438/384 |
| 6,365,482 B1 | * | 4/2002 | Maghsoudnia | 438/384 |
| 6,921,962 B1 | * | 7/2005 | Bailey et al. | 257/537 |
| 2005/0003673 A1 | * | 1/2005 | Mahdavi | 438/710 |

* cited by examiner

*Primary Examiner*—Binh X. Tran
(74) *Attorney, Agent, or Firm*—Fogg & Powers LLC; Scott V. Lundberg

(57) ABSTRACT

The formation of devices in semiconductor material. In one embodiment, a method of forming a semiconductor device is provided. The method comprises forming at least one hard mask overlaying at least one layer of resistive material. Forming at least one opening to a working surface of a silicon substrate of the semiconductor device. Cleaning the semiconductor device with a diluted HF/HCL process. After cleaning with the diluted HF/HCL process, forming a silicide contact junction in the at least one of the opening to the working surface of the silicon substrate and then forming interconnect metal layers.

22 Claims, 14 Drawing Sheets

INTEGRATED PROCESS FOR THIN FILM RESISTORS WITH SILICIDES

CROSS REFERENCE TO RELATED APPLICATIONS

This application claims the benefit under 35 U.S.C. § 119(e) of a U.S. Provisional Application No. 60/646,189, filed Jan. 21, 2005 which is incorporated herein by reference.

TECHNICAL FIELD

The present invention relates to integrated circuits and in particular devices formed in integrated circuits.

BACKGROUND

The formation of devices in semiconductor material that utilize thin films are well known in the art. These thin films may comprises a variety of material such nickel chromium (NiCr) and chromium silicon (CrSi). The efficiency and accuracy of the devices depends upon the condition of the thin film material used and the cleanliness of electrical interconnections. Films (or layers) that are corroded or contaminated provide undesirable results. For example, resistor layers that are corroded or contaminated (e.g. has highly oxidized chromium) are undesirable because such conditions adversely affect the sheet resistance of the resistor.

Prior art process in forming semiconductor devices typically use hydrofluoric (HF) acid cleans in the formation to avoid contamination. However, prior art HF acid cleaning methods of semiconductor devices that include thin film resistors, silicide junctions and capacitors, can have a detrimental effect. For example, HF acid can degrade resistor match. Moreover, HF acid cleans prior to metal interconnect deposition can pit silicon junctions which degraded the junctions performance and degrade capacitor breakdown.

For the reasons stated above, and for other reasons stated below that will become apparent to those skilled in the art upon reading and understanding the present specification, there is a need in the art for a method of forming relatively high performance devices in semiconductor material.

SUMMARY

The above mentioned problems as well as other problems are resolved by the present invention and will be understood by reading and studying the following specification.

In one embodiment, a method of forming devices on a semiconductor wafer is provided. The method comprises depositing an oxide layer overlaying the semiconductor wafer. Depositing a layer of SiCr. Depositing a mask layer of TiN overlaying the layer of SiCr. Patterning the layer of SiCr and TiN layer to a desired shape. Applying a HF/HCL cleaning process to the semiconductor wafer. Removing any remaining mask layer of TiN and depositing one or more interconnect metal layers.

In another embodiment, a method of forming a semiconductor device is provided. The method comprises forming at least one hard mask overlaying at least one layer of resistive material. Forming at least one opening to a working surface of a silicon substrate of the semiconductor device. Cleaning the semiconductor device with a diluted HF/HCL process. After cleaning with the diluted HF/HCL process, forming a silicide contact junction in the at least one of the opening to the working surface of the silicon substrate and then forming interconnect metal layers.

In still another embodiment, a method of forming devices in an integrated circuit is provided. The method comprises forming at least one patterned field oxide on a select portion of a working surface of a substrate of the integrated circuit. Forming at least one doped device junction in the substrate using the at least one field oxide as mask. Depositing an oxide layer overlaying the substrate. Depositing a SiCr layer overlaying the oxide layer. Depositing a mask TiN layer overlaying the SiCr layer. Patterning the TiN and SiCr layers. Forming at least one opening through the oxide layer to the at least one doped junction in the substrate. Cleaning the substrate with a diluted HF/HCL process. After cleaning with the diluted HF/HCL process, forming at least one silicide contact junction in the at least one of the opening to the at least one doped junction. Removing any remaining mask TiN layer and forming interconnect metal layers.

In another embodiment, a semiconductor device is provided. The semiconductor device includes a silicon substrate, at least one silicide contact, an oxide layer and at least one thin film resistor. The silicon substrate has a working surface. The at least one silicide contact junction is formed adjacent the working surface of the substrate. The oxide layer overlays the working surface of the substrate. The least one thin film resistor overlays the oxide layer. Moreover, the silicide contact junctions and the thin film resistors are formed during the same process.

In still another embodiment, an integrated circuit is provided. The integrated circuit includes a silicon substrate having a working surface, at least one field oxide, at least one PtSi silicide contact junction, oxide layer, a resistor, a first interconnect layer and a second interconnect layer. Each field oxide overlays a select portion of the working surface of the substrate. The at least one PtSi silicide contact junction is formed adjacent the working surface of the substrate. The oxide layer overlays the field oxide layer and portion of the working surface of the substrate. The resistor is formed from a resistive layer that overlays a portion of the oxide layer. The first interconnect layer overlays the resistive layer, the oxide layer and the PtSi silicide contact junction. Moreover, the first interconnect layer has an opening to expose a portion of the resistive layer. The second interconnect layer overlays the first interconnect layer. The second interconnect layer has an opening aligned with the opening in the first interconnect layer to the exposed the portion of the resistive layer.

In further still another embodiment, an integrated circuit is provided. The integrated circuit includes at least one capacitor, at least one resister and at least one silicide contact. The least one capacitor includes a top plate, a bottom plate and an oxide layer. The top plate is formed from a SiCr layer and at least one metal layer. The bottom plate is formed from a doped junction in a substrate of the at least one capacitor. The oxide layer is positioned between the top plate and the bottom plate. The at least one resistor is formed from the SiCr layer and the at least one silicide contact junction is formed in the substrate.

In yet further another embodiment, an integrated circuit is disclosed. The integrated circuit includes at least one patterned field oxide, at least one device junction, a cap deposition layer, a silicide contact junction, a SiCr layer and at least one metal interconnect layer. The at least one patterned field oxide is formed on a working surface of a substrate. The at least one device junction is formed in substrate. An edge of the at least one field oxide defines the edge of the at least one device junction. The cap deposition layer overlays the surface of the substrate and the field oxide. The cap deposition layer has at least one opening to the surface of the substrate adjacent to one of the at least one device junctions. The silicide contact junction is formed in the at least one opening. The SiCr layer is formed overlaying the cap deposition layer and the at least one metal interconnect layer formed over the SiCr layer.

BRIEF DESCRIPTION OF FIGURES

The present invention can be more easily understood and further advantages and uses thereof are more readily apparent, when considered in view of the detailed description and the following figures in which.

In accordance with common practice, the various described features are not drawn to scale but are drawn to emphasize specific features relevant to the present invention. Reference characters denote like elements throughout the figures and text.

DETAILED DESCRIPTION

Figure 1:
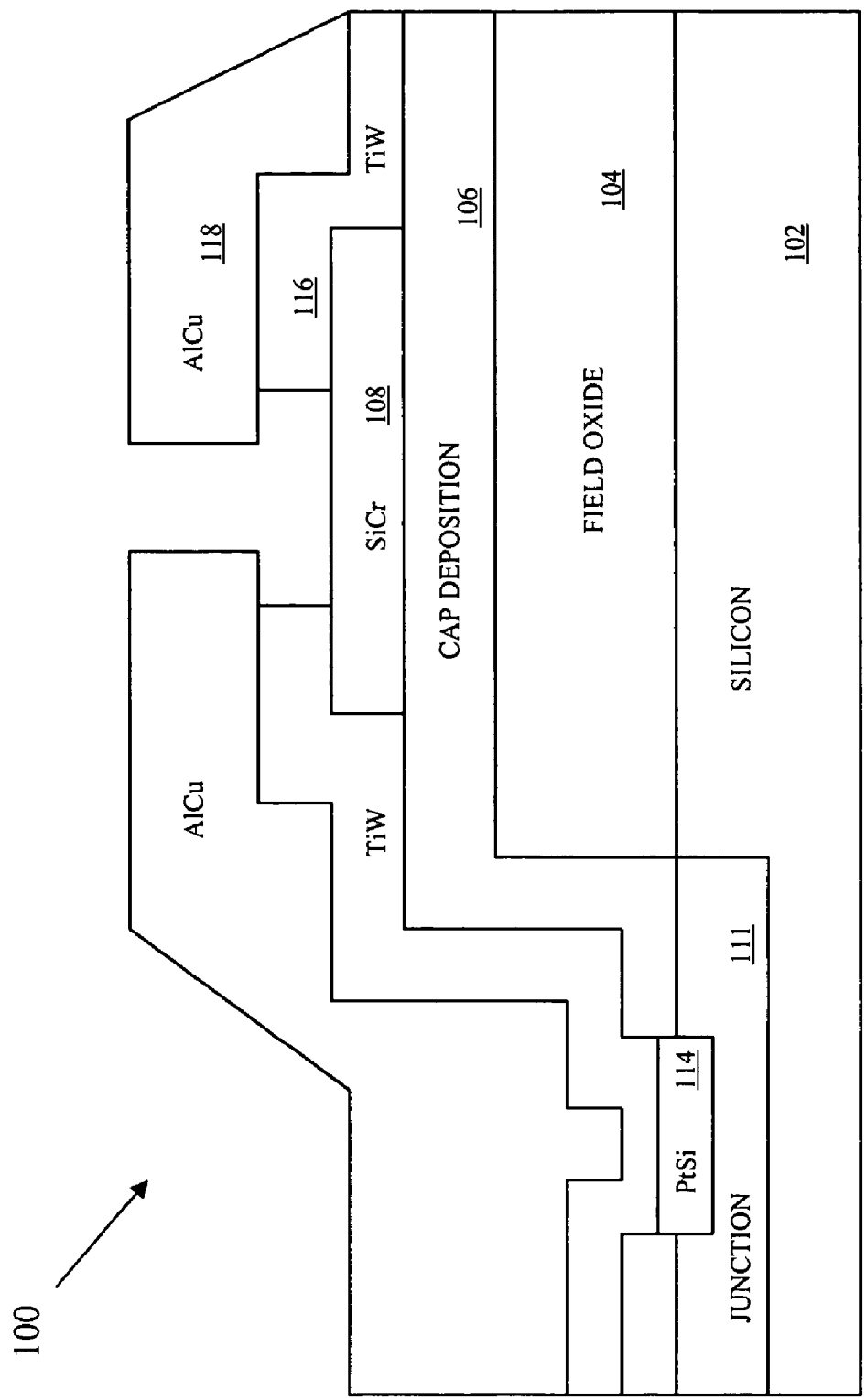
FIG. 1 is a cross-sectional view of a device of one embodiment of the present invention.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal plane" or "lateral plane" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "overlaying," "top" and "under" are defined with respect to the conventional plane or working surface being on the top surface of the wafer or substrate, regardless of the orientation of the wafer or substrate.

The present invention provides relatively high performance devices formed on a wafer such as resistors, silicide contacts and capacitors. In one embodiment, a fabrication process that allows relatively high matching resistors and silicide contact junctions to be build on the same wafer. In one embodiment, the resistors are formed from chromium silicon (CrSi) and the silicide contact junctions are formed with platinum silicon (PtSi). In embodiments, an improved hard mask process is used. In particular, a pre-platinum silicide cleaning process consisting of diluted HF and diluted HCL (HF/HCL clean process) is used in embodiments of the present invention. Further in one embodiment, a sequence of process steps include, the use of TiN hard mask, dry etch, the pre-platinum cleaning and a final hydrogen peroxide clean prior to metal interconnect deposition. The HF/HCL clean process allows for good silicides to form but does not attack (or degrade) hard masks used in the process to form resistors.

Referring to FIG. 1, a semiconductor structure 100 of one embodiment of the present invention is illustrated. As illustrated, this embodiment includes an oxide layer 106, a resistor layer 108, silicide contact junction 114 and a device junction 111. The junction 111 is an area formed in a device region of the substrate 102 that is doped to provide select semiconductor characteristics. The oxide layer 106 separates the interconnect metal from the device regions. The interconnect metal layer in this embodiment includes the TiW layer 116 and the AlCu layer 118. In other embodiments, other types of conductive layers are used to form the interconnect layer. In general, the device region is formed in the substrate 102 beneath the interconnect metal. The oxide layer 106 is formed to have a high enough breakdown to prevent shorts between the interconnect metal and the device regions. The oxide layer 106 can also serve a capacitor if the device region is highly doped. If this is the case, the oxide layer 106 can be referred to as a capacitor deposition (cap dep) layer 106. The junctions of the devices formed in the substrate 102 are connected through silicide contact 114.

The semiconductor structure 100 of FIG. 1 and in particular the resistive layer 108 and interconnect metal layers 116 and 118 can be used as a conventional resistor in an integrated circuit. The active part of the resistor is layer 108 which is, in this embodiment, a layer of SiCr 108. In another embodiment a layer 108 of NiCr is used. The AlCu lines 118 are connected to other devices in an integrated circuit to form a circuit with the resistor. In particular, a conventional thin film resistor is formed from layers 108, 116 and 118 which can be used in an integrated circuit. The SiCr resistor layer 108 in this embodiment has a relatively high sheet resistance of approximately 2K ohms/square. This makes the resistor especially valuable for circuits operating at a relatively high voltage (higher than 15 volts).

Figure 2A:
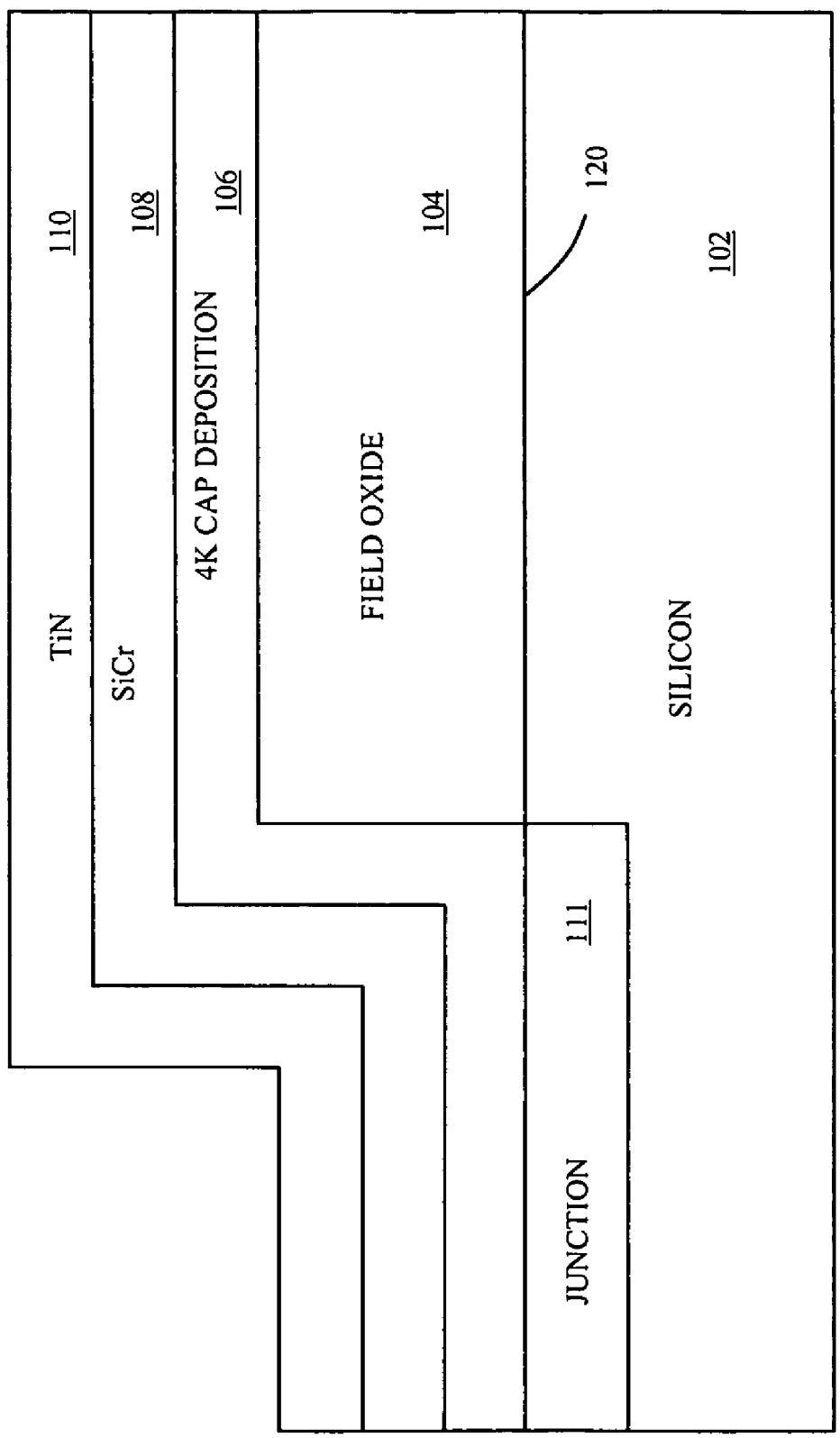
FIG. 2A-2H are cross-sectional views of the formation of a device of one embodiment of the present invention.
Figure 2B:
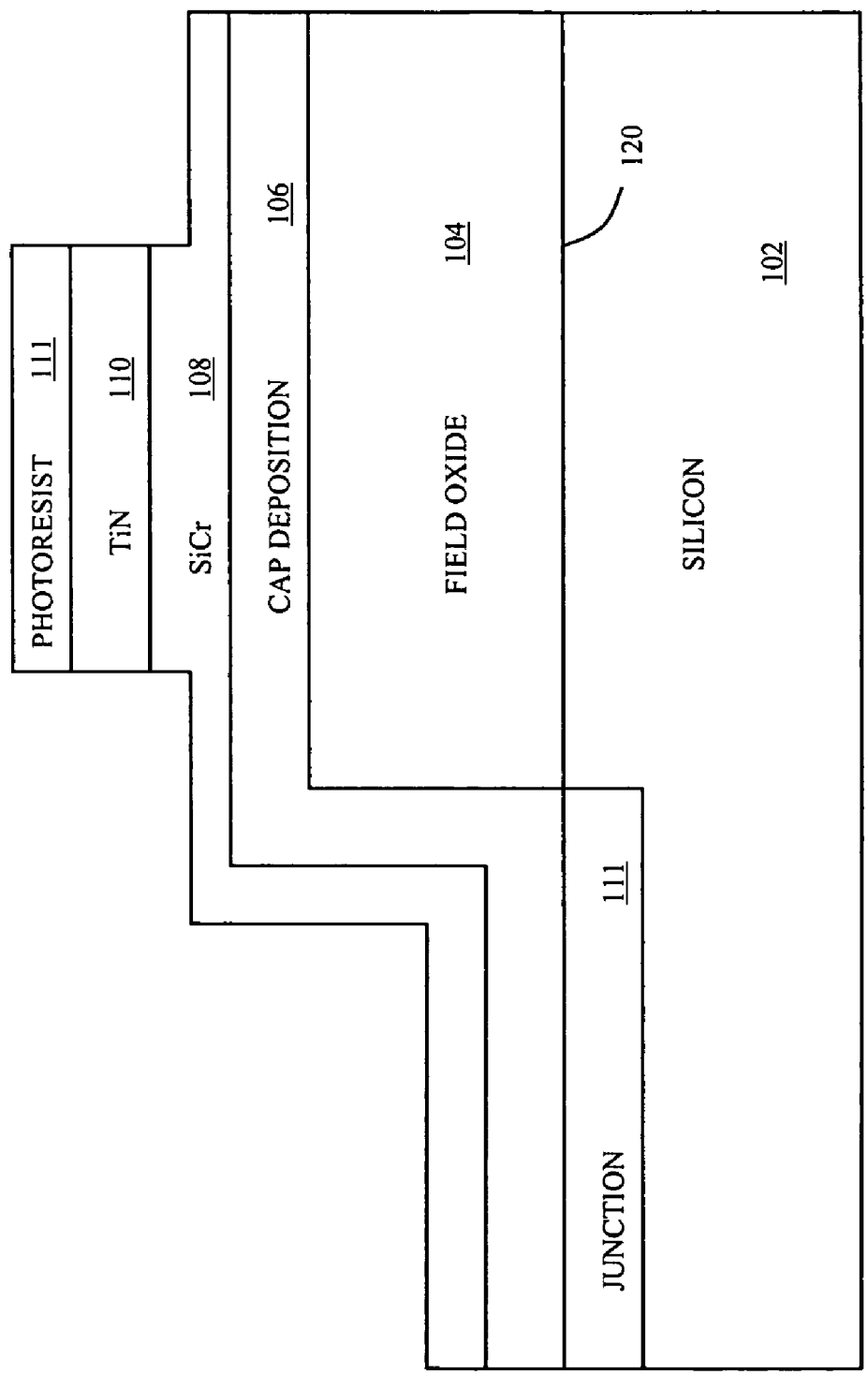
Figure 2C:
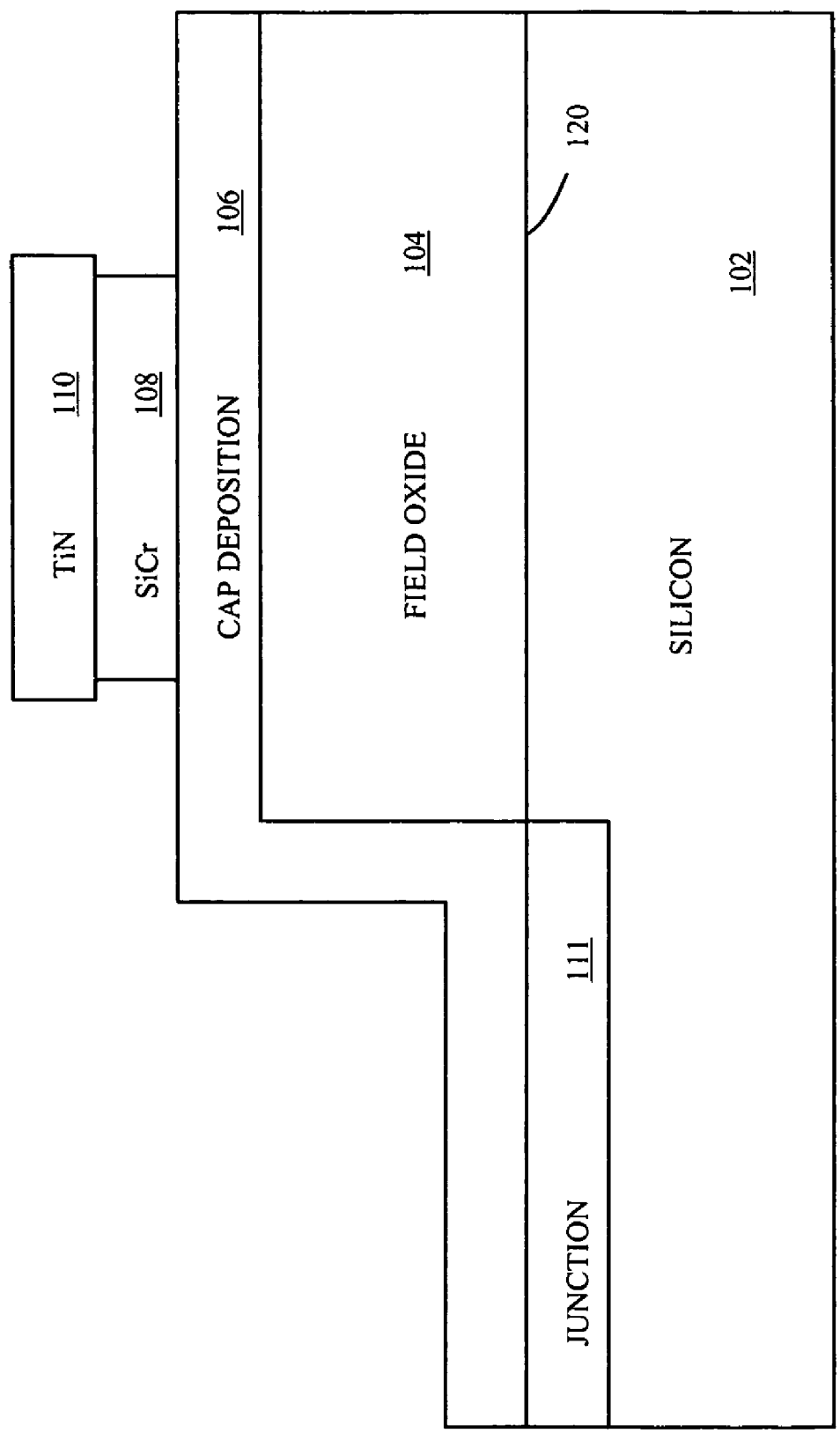

FIGS. 2A through 2H illustrate the formation of a semiconductor device 100 using one method of the present invention. Referring to FIG. 2A, a field oxide 104 is deposited and patterned on a silicon wafer 102 (substrate 102). In one embodiment, the field oxide 104 is used as a mask to define an edge of the doped device junction 111. A oxide layer 106 (cap dep layer 106) is deposited overlaying the field oxide 104 and a working surface 120 of the silicon substrate 102. A SiCr layer 108 is then deposited overlaying the oxide layer 106. The SiCr layer 108 in this embodiment will be formed into a thin film resistor. A hard mask layer of TiN 110 is then formed overlaying the SiCr layer 108. In another embodiment, a hard mask layer of TiW is used. FIG. 2B, illustrates a patterned resist 111 that is used with a timed dry etch which removes all of the TiN layer and some of the SiCr layer in select areas as illustrated. As illustrated, the working surface of the silicon layer 102 is not exposed in this step. In FIG. 2C, a solvent strip is used to remove the patterned resist 111 and a standard SiCr wet etch then performed to form a resistor in this embodiment. In other embodiments, other methods of patterning a thin film resistor is used. As illustrated, more of the SiCr layer 108 has been removed during this process.

Figure 2D:
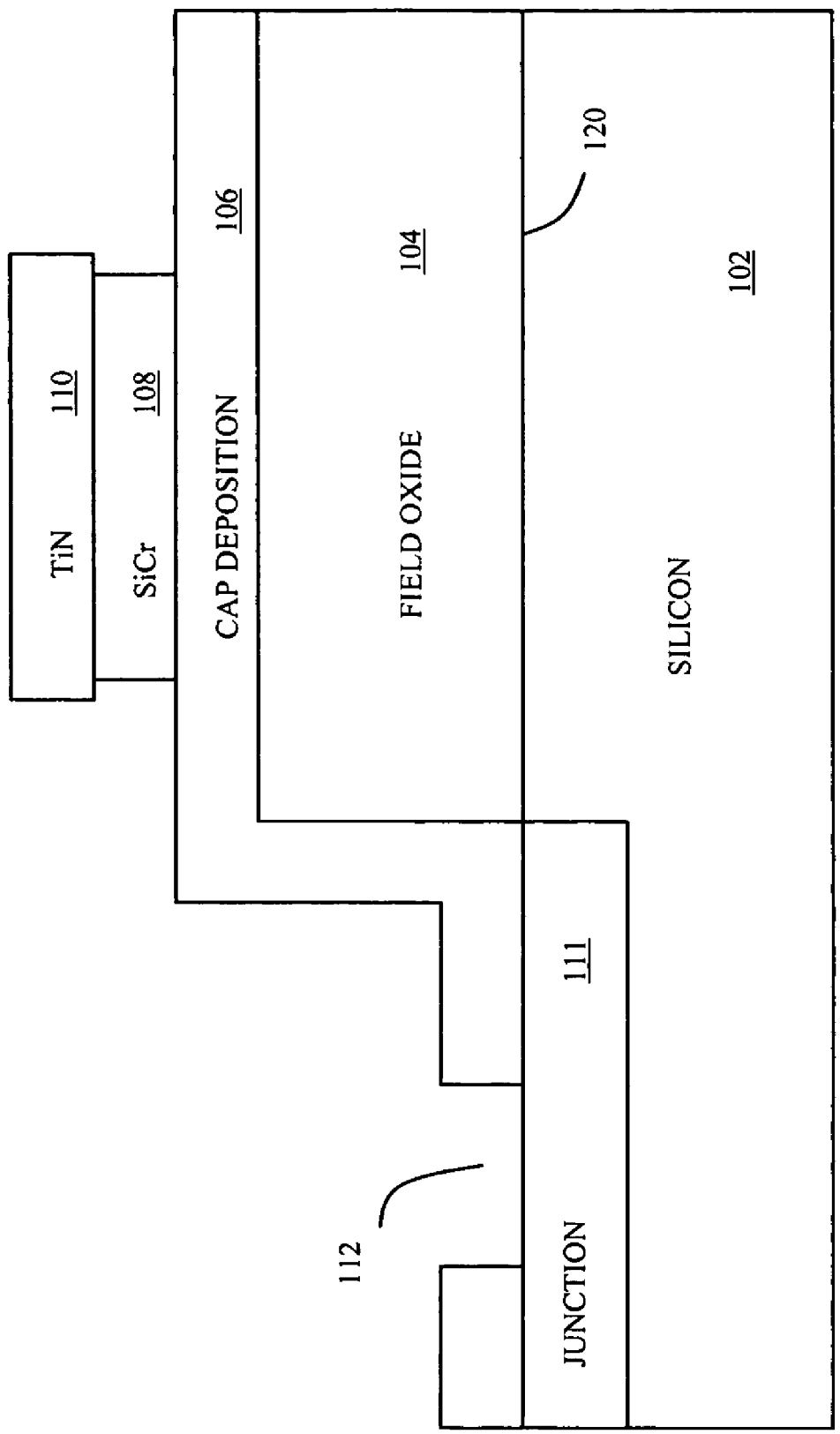
Figure 2E:
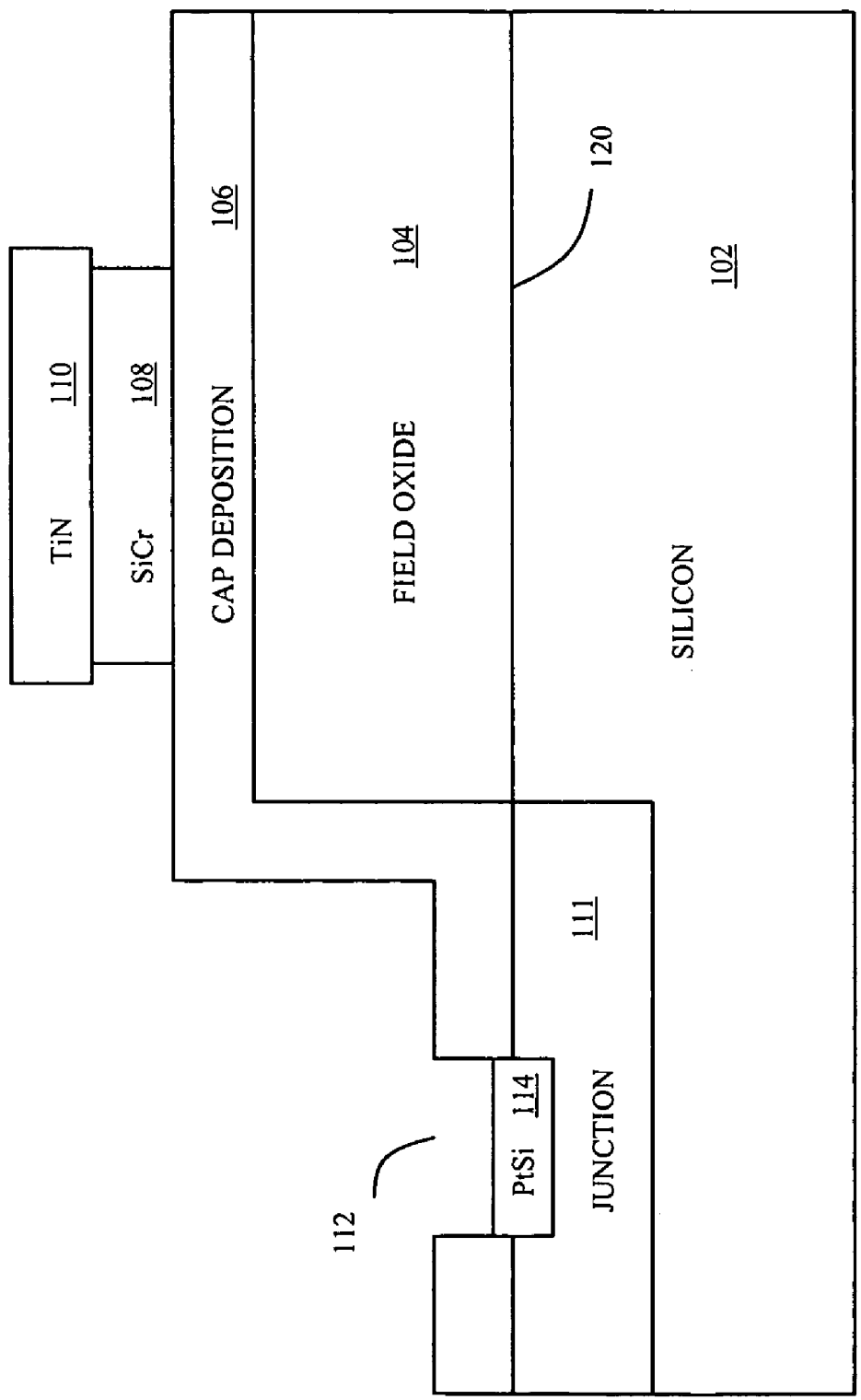

Referring to FIG. 2D, an etch is performed through the oxide layer 106 to form a contact opening 112 to the working surface of the silicon substrate 102 adjacent junction 111. The HF/HCL clean process is then applied to the semiconductor device and then the Pt is deposited to form a PtSi contact junction 114 (silicide contact junction) as illustrated in FIG. 2E. Silicide contact junctions provide low resistance electrical silicide contacts to device junctions formed in substrates such as junction 111 of FIG. 2E. As indicated above, the HF/HCL clean process does not degrade the TiN mask 110. In one embodiment, the HF/HCL clean process includes a 40:1 dilute of HF that is applied for approximately 60 seconds and a 6:1 HCL at approximately 50° C.that is applied for approximately 70 seconds. In one embodiment, a sinter and aqua regia process is used after the PtSi contact 114 is formed. The aqua regia attacks and removes a portion but not the entire TiN hard mask 110.

Figure 2F:
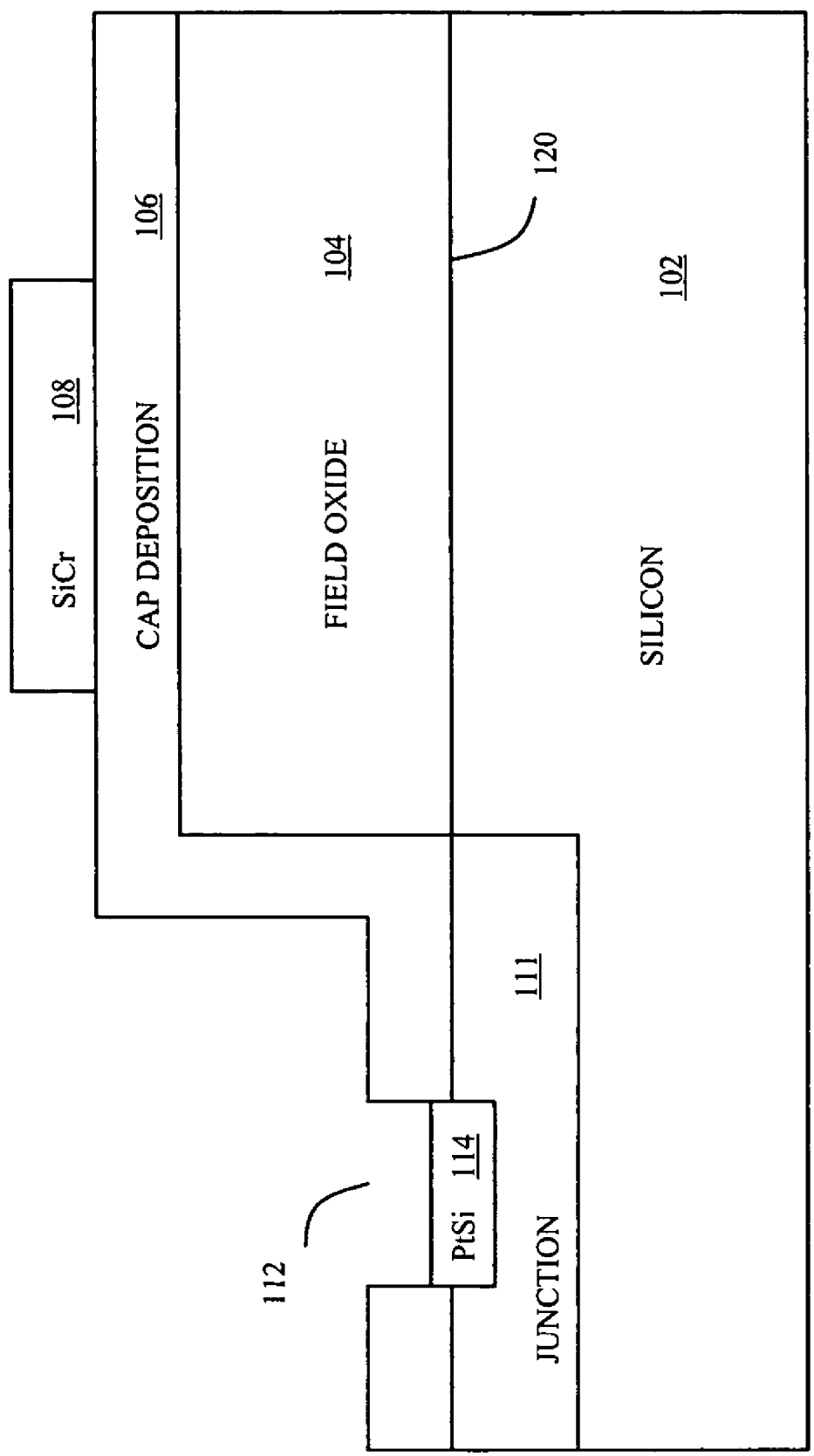
Figure 2G:
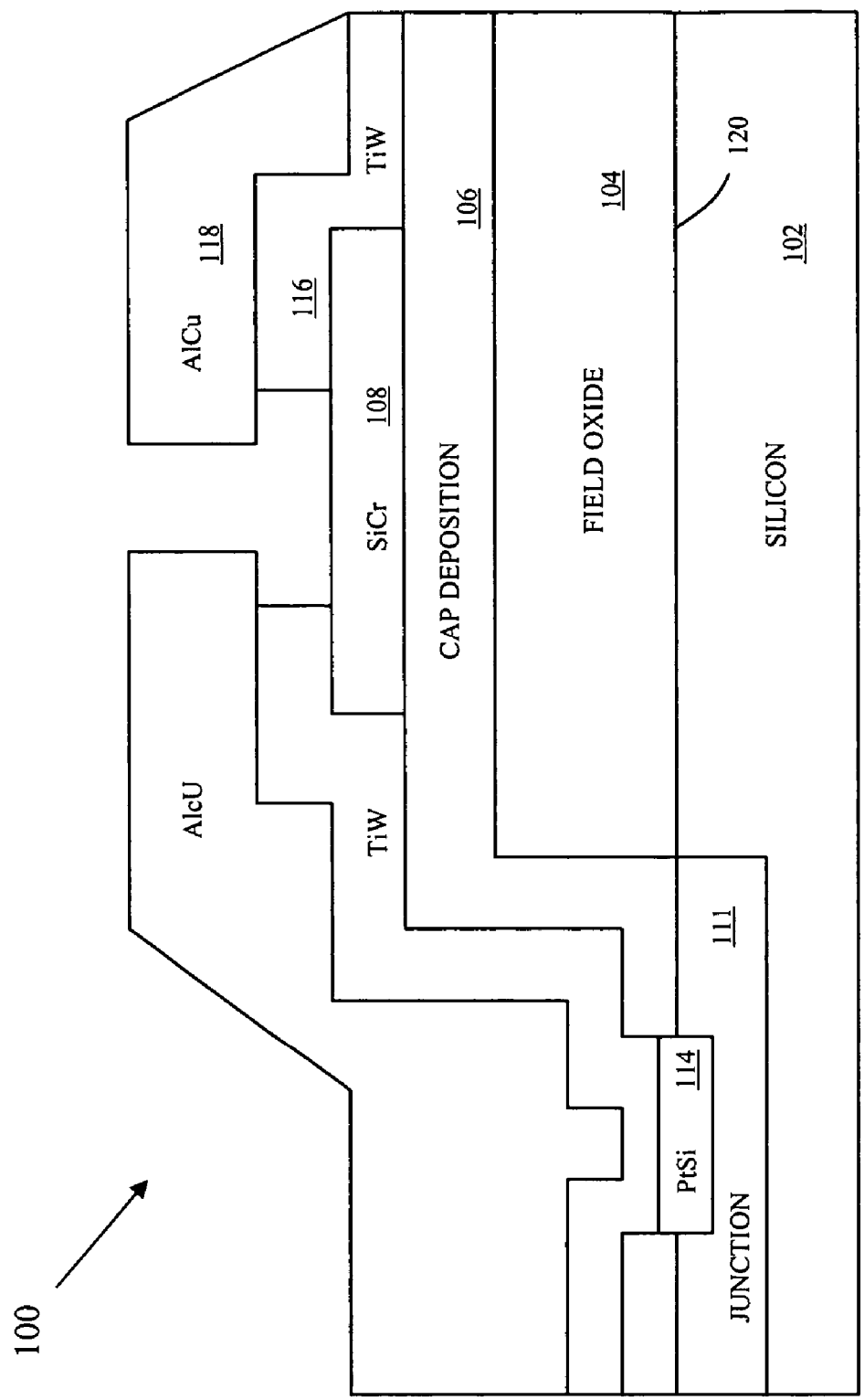

The TiN hard mask 110 is then etched away as illustrated in FIG. 2F. In one embodiment, this is a hydrogen peroxide etch that does not effect the SiCr layer 108, the PtSi in the silicide contact junction 114. The interconnect metal layers are then formed on the substrate. By using the processes discussed above, a pre-Al dip of the prior art is not required before the metal layers are formed. Referring to FIG. 2G, the formation of the interconnect metal layers are illustrated. In one embodiment, a first interconnect layer of TiW 116 and a second interconnect layer of AlCu 118 is deposited and patterned to form the first and second interconnect metal layers 116 and 118 of the device 100. In particular, in one embodiment, the AlCu layer 118 is patterned with a plasma dry etch. The TiW acts as a stopping layer to protect the SiCr layer 108 from the plasma dry etch. The TiW is then patterned with a wet etch to expose a select portion of the SiCr 108 layer. In one embodiment the wet etch is a peroxide wet etch which does not effect the SiCr 108 layer. In another embodiment the first interconnect layer is made from TiN.

Figure 2H:
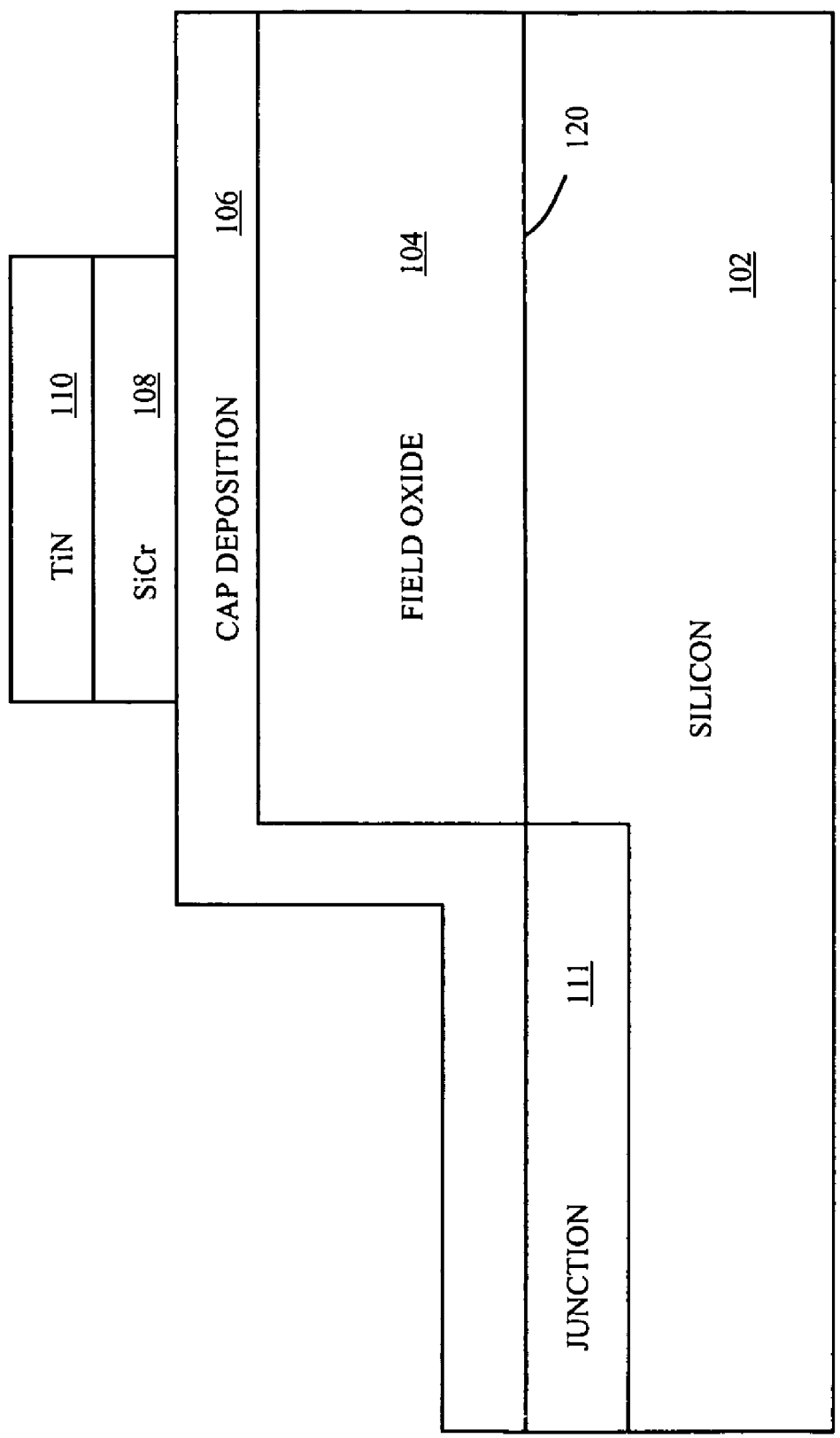

FIG. 2H illustrates another embodiment in patterning the TiN and SiCr layers 110 and 108. In this embodiment, the dry etch of the TiN 110 layer is extended so that it also completely removes select portions of the SiCr layer 108. This embodiment further requires a plasma oxygen clean or a simple diluted HF dip after the solvent strip since the solvent strip is not sufficient to clean the oxide layer 106 surface. As illustrated in FIG. 2H, the edges of the SiCr layer 108 is aligned with the edges of the TiN layer 110. In this embodiment the remaining process steps as discussed in relation to FIGS. 2D through 2F are performed to achieve the device 100 of FIG. 2G.

Figure 3A:
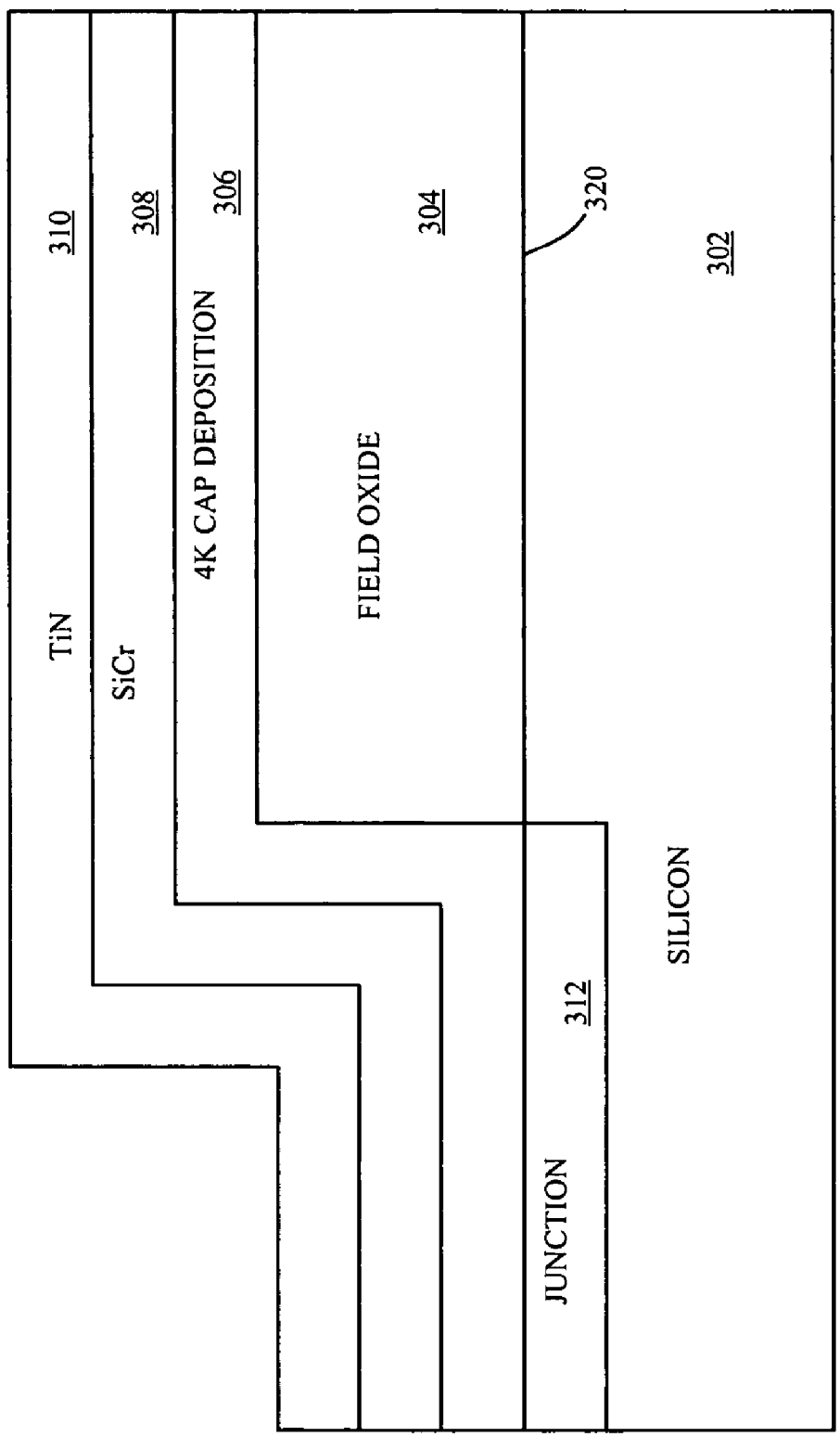
FIG. 3A-3D is a flow diagram illustrating a process of forming a device and a device of one embodiment of the present invention.
Figure 3B:
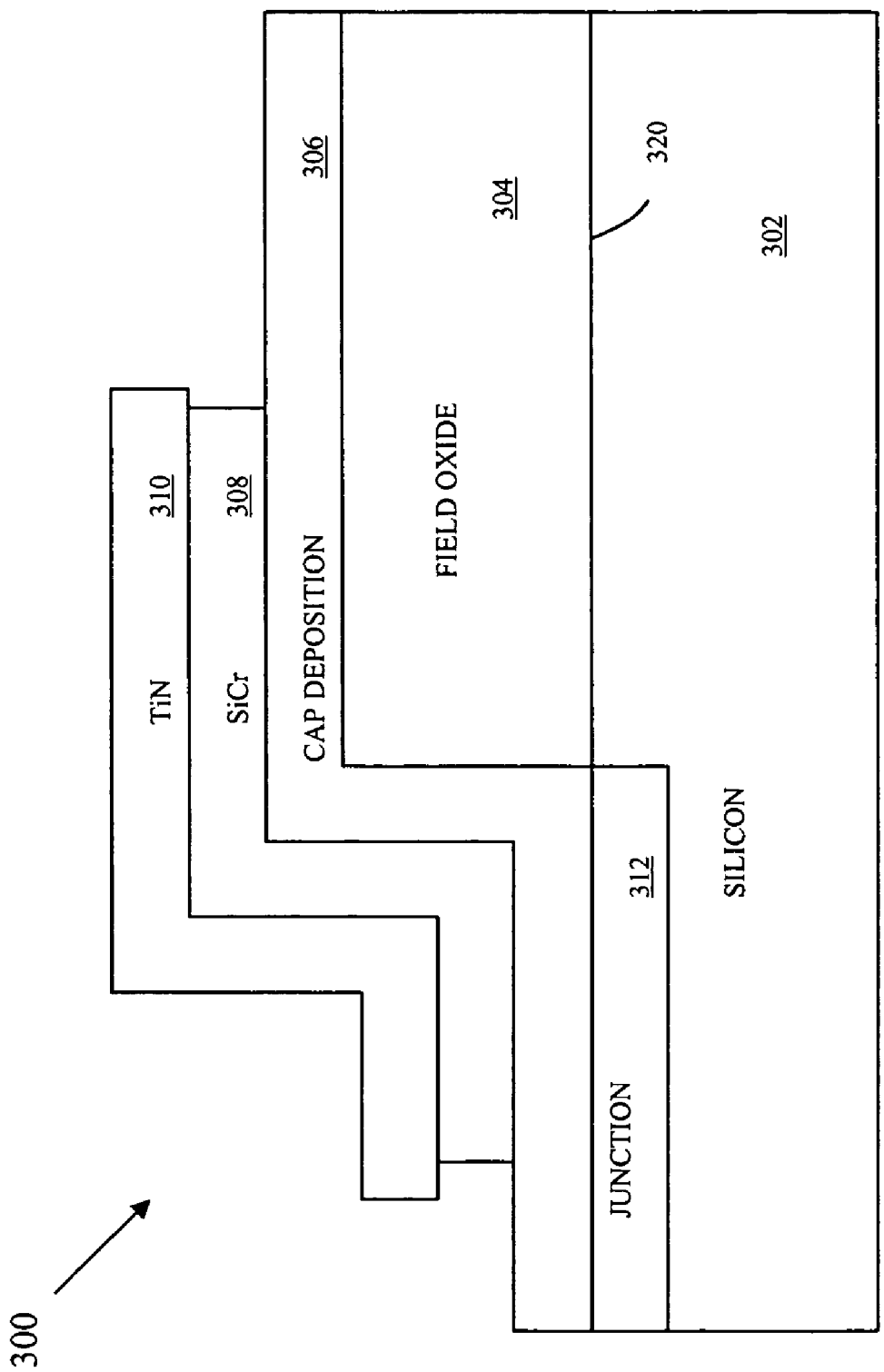

FIGS. 3A through 3B illustrate the formation of another semiconductor device 300 of another embodiment of the present invention using similar processes as discussed above. In this embodiment a capacitor is formed. As illustrated in FIG. 3A, this embodiment starts off similar to the embodiment of FIG. 2A. In particular, a field oxide 304 is deposited and patterned on a silicon wafer 302 (substrate 302). A 4K cap deposition 306 (cap dep layer 306) is deposited overlaying the field oxide 304 and a working surface 320 of the silicon substrate 302. A SiCr layer 308 is then deposited overlaying the cap dep layer 306. A hard mask layer of TiN 310 is then formed overlaying the SiCr layer 108. Also illustrated in FIG. 3A is device junction 312 formed in the substrate 302. In one embodiment the field oxide is used as a mask in forming the junction 312 and hence the field oxide 304 defines an edge of device junction 312.

Referring to FIG. 3B, the TiN layer and the SiCr layer 308 is etched. In particular, in one embodiment, a patterned resist and timed dry etch is then performed to remove select sections of the TiN layer 110. A solvent strip is then used and a standard SiCr wet etch is performed to produce what is illustrated in FIG. 3B. In another embodiment, the timed dry etch is prolonged so that select portions of the SiCr layer is removed without the SiCr wet etch. In this embodiment, the solvent strip is followed by either a plasma oxygen clean or a diluted HF dip to properly clean the oxide surfaces.

Figure 3C:
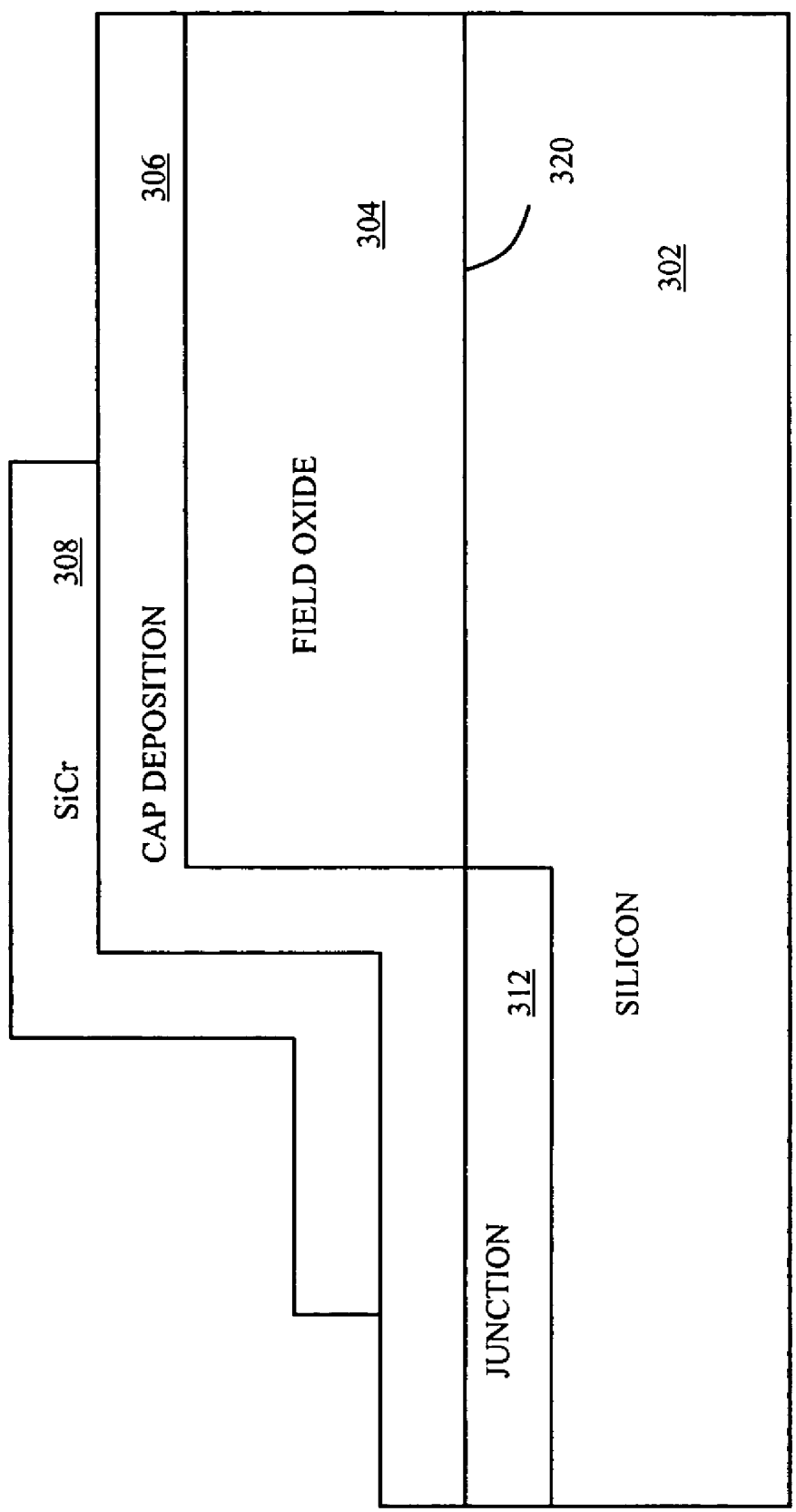
Figure 3D:
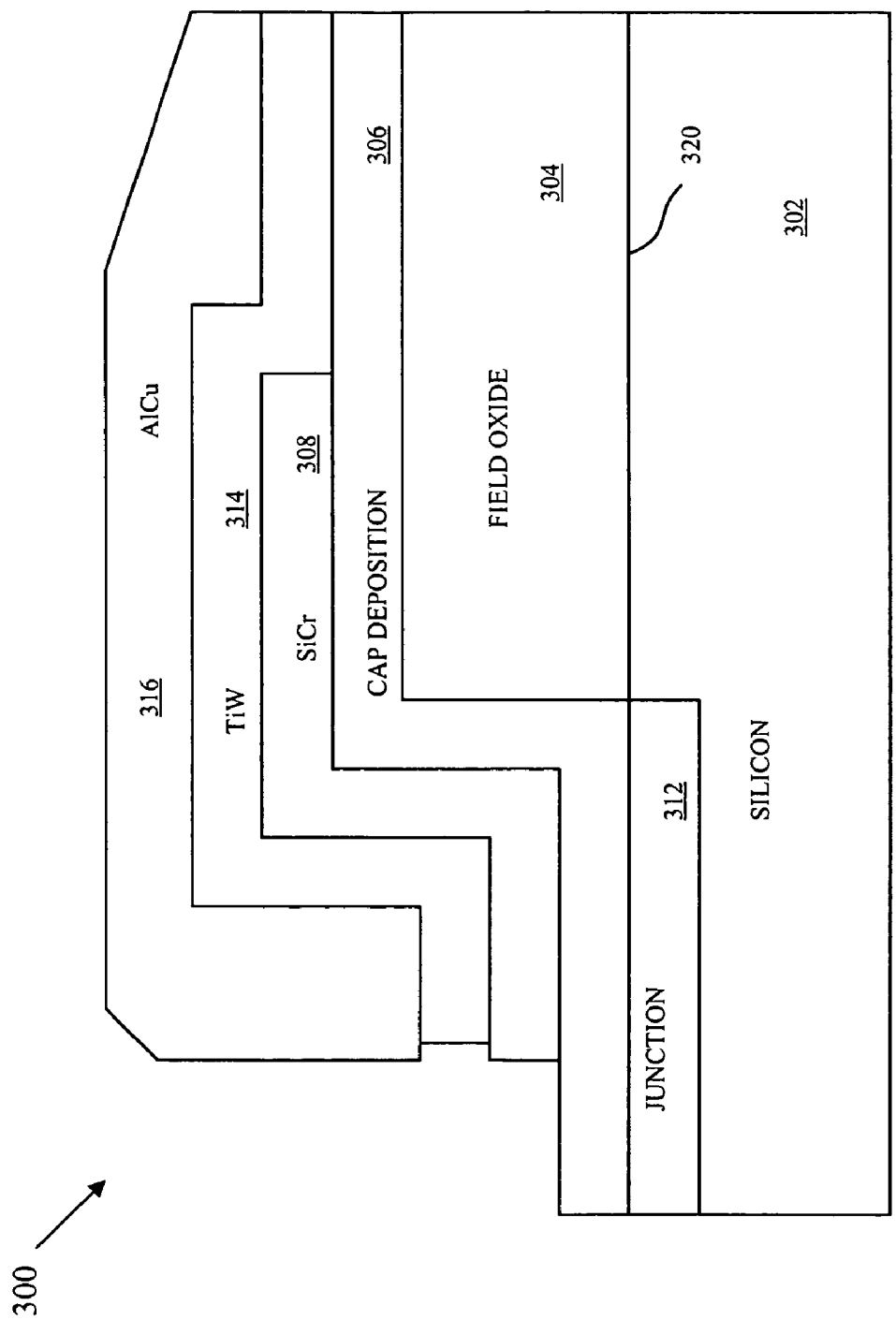

In one embodiment, a pre-clean process is applied. Further in one embodiment, the pre-clean process includes a 40:1 dulute of HF that is applied for approximately 60 seconds and a 6:1 HCL at approximately 50° C. that is applied for approximately 70 seconds. A Pt strip is then applied (420). In one embodiment, the Pt strip includes an aqua regia mixture that dissolves some of the remaining TiN layer (420). A TiN residual etch is then performed to remove the remaining TiN (422) as illustrated in FIG. 3C. A layer of TiW and AlCu is then respectfully deposited and patterned as illustrated in FIG. 3D. In particular, FIG. 3D illustrates a capacitor device 300 of one embodiment of the present invention. Junction 312 forms a bottom plate of a capacitor and layers 308, 314 and 316 form a top plate of the capacitor. The cap deposition layer 306 is an oxide that separates and prevents shorts between the interconnect metal (which in this embodiment is layers 316, 314 and 308 from the device region (which in this embodiment includes junction 312). This is done by scaling the thickness of the cap deposition layer 106 according to the voltage requirements. This is a trade off against the circuit requirements of thinner oxide in order to get more capacitance per unit area. Thus an optimal thickness for given circuit requirement must be selected. The cap deposition layer 306 serves as a capacitor when the device region is highly doped (i.e. junction 312). Embodiments of the resistors with silicide junctions formed in FIGS. 2A through 2H and capacitors as illustrated in FIGS. 3A through 3D can be formed together to form components of an integrated circuit. Moreover, it will be understood in the art that a silicide contact junction can be formed to provide an electrical connection to the bottom plate 312 by the methods discussed above.

Figure 4:
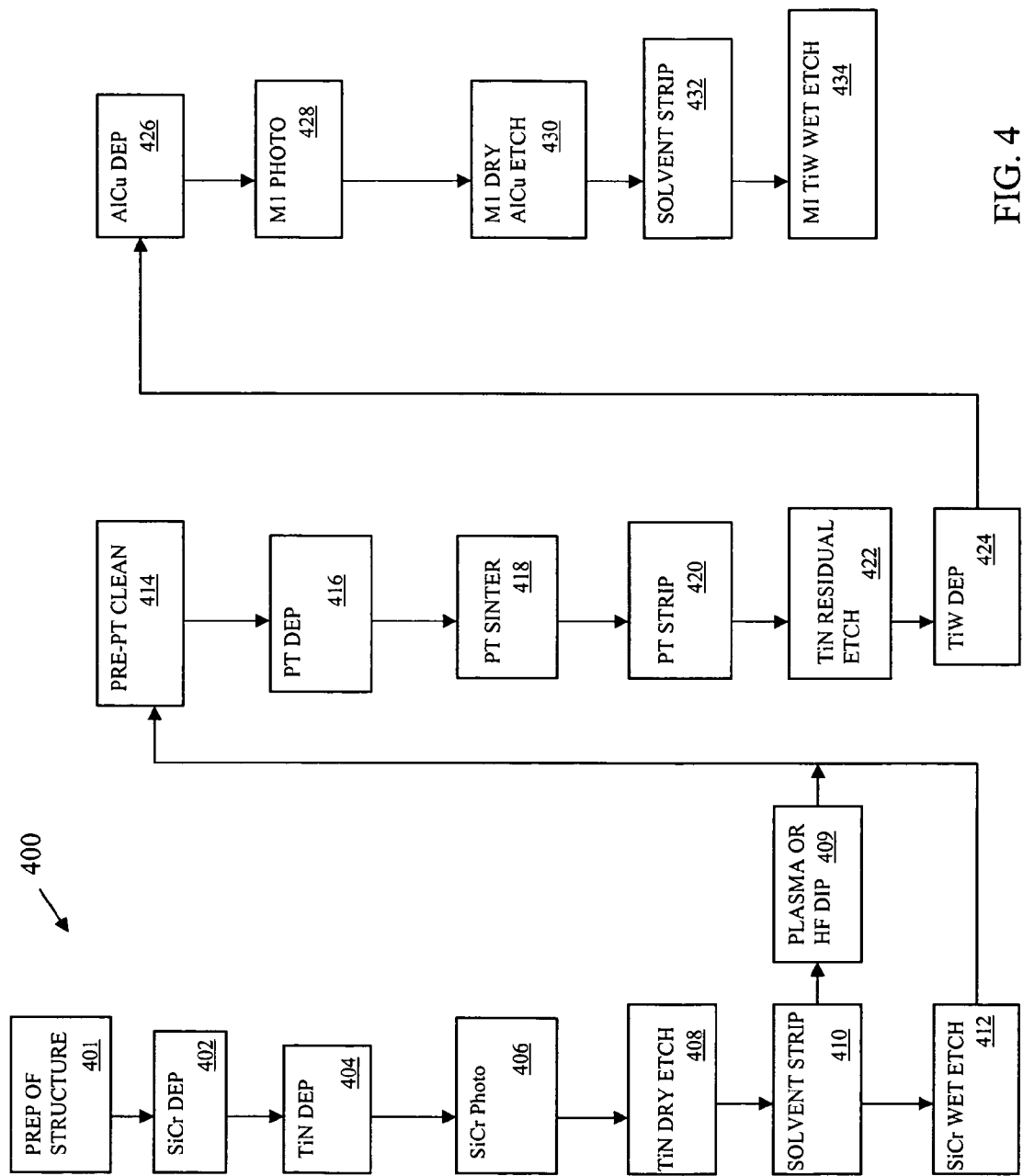
FIG. 4 is a flow diagram of the process of forming a device in one embodiment of the present invention.

A flow diagram 400 illustrating the steps of formation of a device of one embodiment of the present invention is illustrated in FIG. 4. After a field oxide layer had been deposited and patterned on a substrate, a cap deposition layer is deposited overlaying a surface of the substrate and the field oxide to prepare for the formation of the device (401). A SiCr deposition layer is then formed overlaying the cap deposition layer (402). A TiN deposition layer is then formed overlaying the SiCr layer (404). A SiCR photo is applied (406). In this embodiment, the SiCR photo step is actually the combined steps of a dehydration bake, an application of an organic adhesion promoter, the spinning on of a resist coat, an exposing of the pattern, a developing of the resist and performing a pre-etch resist hard bake. In one embodiment, applying the organic adhesion promoter is in vapor form. In this embodiment, a patterned resist and timed TiN dry etch is performed to remove part of the TiN layer as well as part of the SiCr layer (408). A solvent strip is then used (410). A SiCr wet etch is then used to remove the SiCr layer from areas not protected by the TiN layer (412).

In another embodiment the areas of the SiCr layer that are to be removed from the cap deposition layer are done so by extending the timed TiN dry etch (408). In this embodiment, the solvent strip is followed by a plasma oxygen clean or a simple diluted HF dip instead of a (409). In this embodiment, the plasma oxygen clean or the HF dip are required after the solvent strip because the solvent strip will not sufficiently clean up the oxide surface.

Next a pre-clean process is applied (414). In one embodiment, the pre-clean process includes a 40:1 dilute of HF that is applied for approximately 60 seconds and a 6:1 HCL at approximately 50° C. that is applied for approximately 70 seconds. Once the pre-clean process is completed, Pt is deposited (416). A Pt sinter is then performed to form a PtSi junction contact in one embodiment (418). A Pt strip is then applied (420). In one embodiment, the Pt strip includes an aqua regia mixture that dissolves some of the remaining TiN layer (420). A TiN residual etch is then performed to remove the remaining TiN (422). A layer of TiW is then deposited (424). A layer of AlCu is then deposited overlaying the layer of TiW (426). A M1 photo is applied (428). In this embodiment, the M1 photo step is actually the combined steps of a dehydration bake, an application of an organic adhesion promoter, the spinning on of a resist coat, an exposing of the pattern, a developing of the resist and performing a pre-etch resist hard bake. A M1 dry etch is then performed to remove a section of AlCu (430). After a solvent strip is used (432), a M1 TiW wet etch is performed.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method of forming devices on a semiconductor wafer, the method comprising:
   depositing an oxide layer overlaying the semiconductor wafer;
   depositing a layer of SiCr;
   depositing a mask layer of TiN overlaying the layer of SiCr;
   patterning the layer of SiCr and TiN layer to a desired shape;
   applying a HF/HCL cleaning process to the semiconductor wafer;
   removing any remaining mask layer of TiN;
   depositing one or more interconnect metal layers;
   wherein applying a HF/HCL process further comprises, applying a 40:1 dilute of HF for approximately 60 seconds and applying a 6:1 dilute of HCL at approximately 50° C. for approximately 70 seconds.

2. The method of claim 1, further comprising:
   patterning a contact opening through the oxide layer to expose a portion of a working surface of the semiconductor wafer; and
   depositing Pt to form a PtSi contact junction in the contact opening.

3. The method of claim 1, further comprising:
   patterning an opening through the one or more interconnect metal layers to the patterned layer of SiCr to form a thin film resistor.

4. The method of claim 1, wherein patterning the layer of SiCr and TiN layer to a desired shape further comprises:
   applying a TiN dry etch; and
   applying a SiCr wet etch after the TiN dry etch.

5. The method of claim 1, wherein patterning the layer of SiCr and TiN layer to a desired shape further comprises:
   applying a TiN dry etch until the desired amount of TiN and SiCr layer is removed; and
   applying at least one of a plasma and HF dip.

6. The method of claim 1, further comprising:
   forming at least one device junction in the semiconductor wafer.

7. The method of claim 6, further comprising:
   forming at least one field oxide layer on the working surface of the semiconductor wafer; and
   using the at least one field oxide layer as a mask in defining an edge of the at least one device junction.

8. The method of claim 6, further comprising:
   forming a bottom plate of a capacitor with the at least one device junction;
   forming an upper plate of the capacitor with the layer of SiCr and the one or more interconnect metal layers.

9. A method of forming a semiconductor device, the method comprising:
   forming at least one hard mask overlaying at least one layer of resistive material;
   forming at least one opening to a working surface of a silicon substrate of the semiconductor device;
   cleaning the semiconductor device with a diluted HF/HCL process, wherein the diluted HF/HCL solution includes a 40:1 dilute of HF that is applied for approximately 60 seconds and a 6:1 HCL at approximately 50° C. that is applied for approximately 70 seconds;
   after cleaning with the diluted HF/HCL process, forming a silicide contact junction in the at least one of the opening to the working surface of the silicon substrate; and
   forming interconnect metal layers.

10. The method of claim 9, further comprising:
    forming at least one oxide layer between the working surface of the silicon substrate and the layer of resistive material.

11. The method of claim 9, wherein the layer of resistive material is a SiCr layer.

12. The method of claim 9, wherein the layer of resistive material is a NiCr layer.

13. The method of claim 9, wherein the hard mask is a TiN layer.

14. The method of claim 9, wherein the hard mask is a TiW layer.

15. The method of claim 9, wherein forming the silicide contact junction further comprises:
    depositing Pt in the opening to form a PtSi layer.

16. The method of claim 9, further comprising:
    removing the hard mask with peroxide after the formation of the at least one silicide contact junction.

17. The method of claim 9, further comprising:
    patterning the resistive material layer to form a resistor.

18. The method of claim 17, wherein patterning the resistive material layer, further comprises:
    applying a SiCr wet etch.

19. The method of claim 9, further comprising:
    patterning the interconnect metal layers.

20. The method of claim 19, wherein patterning the interconnect metal layers, further comprises:
    applying a dry etch to pattern a layer of AlCu of the interconnect metal layers; and after the dry etch, applying a wet etch to pattern a layer of TiW of the interconnect metal layers.

21. A method of forming devices in an integrated circuit, the method comprising:

forming at least one patterned field oxide on a select portion of a working surface of a substrate of the integrated circuit;

forming at least one doped device junction in the substrate using the at least one field oxide as mask;

depositing an oxide layer overlaying the substrate;

depositing a SiCr layer overlaying the oxide layer;

depositing a mask TiN layer overlaying the SiCr layer;

patterning the TiN and SiCr layers;

forming at least one opening through the oxide layer to the at least one doped junction in the substrate;

cleaning the substrate with a diluted HF/HCL process;

after cleaning with the diluted HF/HCL process, forming at least one silicide contact junction in the at least one of the opening to the at least one doped junction;

removing any remaining mask TiN layer; and forming interconnect metal layers.

22. The method of claim 21, further comprising:

performing a aqua regia etch after forming the at least one silicide contact junction.

* * * * *